(12) United States Patent
Hayami et al.

(10) Patent No.: US 7,595,656 B2
(45) Date of Patent: Sep. 29, 2009

(54) INTERFACE CIRCUIT AND SEMICONDUCTOR INTEGRATED CIRCUIT

(75) Inventors: Kazunori Hayami, Fukuoka (JP); Tetsuya Ohtani, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/998,399

(22) Filed: Nov. 29, 2007

(65) Prior Publication Data
US 2008/0180130 A1    Jul. 31, 2008

(30) Foreign Application Priority Data
Jan. 25, 2007    (JP) .............................. 2007-014723

(51) Int. Cl.
*H03K 19/003*    (2006.01)
(52) U.S. Cl. .............................. 326/30; 326/32; 326/26; 326/27; 327/108
(58) Field of Classification Search .................... 326/30, 326/32, 86; 327/108
See application file for complete search history.

(56) References Cited

U.S. PATENT DOCUMENTS

| | | | |
|---|---|---|---|
| 6,924,660 B2 * | 8/2005 | Nguyen et al. ................. | 326/30 |
| 6,992,501 B2 * | 1/2006 | Rapport ........................ | 326/30 |
| 7,193,431 B2 | 3/2007 | Miyake et al. | |
| 7,227,382 B1 * | 6/2007 | Talbot et al. ................... | 326/87 |
| 7,262,643 B2 | 8/2007 | Hayashi et al. | |
| 2002/0113638 A1 | 8/2002 | Takauchi et al. | |
| 2002/0163355 A1 * | 11/2002 | van Bavel et al. ............. | 326/30 |

FOREIGN PATENT DOCUMENTS

| | | |
|---|---|---|
| JP | 5-276010 | 10/1993 |
| JP | 2002-185300 | 6/2002 |
| JP | 2002-536879 | 10/2002 |
| JP | 2004-327602 | 11/2004 |
| JP | 2006-66833 | 3/2006 |
| WO | WO00/45558 | 8/2000 |

* cited by examiner

*Primary Examiner*—Vibol Tan
(74) *Attorney, Agent, or Firm*—Fujitsu Patent Center (57) ABSTRACT

An interface circuit includes a driver circuit (12) made up of a combination of a plurality of transistors, a calibration circuit (14) for performing selection of on and off of one or more of the plurality of transistors for adjusting on-resistance thereof, and a terminating resistor (13) that is connected to an output side of the driver circuit (12). One or more of the transistors are turned on based on an output of the calibration circuit (14), so that a combination resistance value of the on-resistance and the terminating resistor matches characteristic impedance of the transmission line. The driver circuit (12), the calibration circuit (14) and the terminating resistor (13) are formed on the same semiconductor integrated circuit SK, and the calibration circuit (14) detects process variation and temperature variation of the transistor and the resistor formed on the semiconductor integrated circuit (SK).

6 Claims, 8 Drawing Sheets

INTERFACE CIRCUIT AND SEMICONDUCTOR INTEGRATED CIRCUIT

BACKGROUND OF THE INVENTION

1. Field of the Invention

The present invention relates to an interface circuit and a semiconductor integrated circuit that are used for performing signal transmission with a transmission line, as well as a method for adjusting termination resistance. The present invention can be used as a high speed interface circuit such as a USB driver.

2. Description of the Prior Art

Conventionally, interface circuits are disposed at every place in an internal circuit and an external circuit of a computer. For example, DDR2 (Double Data Rate 2) standard is adopted as an interface circuit for high speed data transmission in an SDRAM that is used as a main memory of a computer. In addition, USB (Universal Serial Bus) standard is used commonly as an interface circuit between a computer and a peripheral device.

In such an interface circuit, it is necessary to match its output impedance with characteristic impedance of a transmission line such as a reception circuit or a cable so as to perform correct transmission by preventing reflections and losses of an output signal. In addition, it is necessary to adjust rise time and fall time (slew rate) of a waveform of the output signal to fall within an appropriate range. If it is too short, it may cause noises. If it is too long, the waveform may be deteriorated.

In order to deal with this problem conventionally, a function for adjusting and controlling termination resistance in the interface circuit is provided inside a memory LSI (Large Scale Integrated circuit) that is a semiconductor integrated circuit. For example, an ODT (On Die Termination) circuit that is provided to a DDR2 standard memory can adjust its termination resistance to a value of 75 ohms or 150 ohms. In other words, the ODT circuit has many transistor pairs of p-type and n-type that are connected in parallel so as to form a terminating resistor. The number of transistors that are connected in parallel actually is adjusted by a control signal supplied to their gates, so that a resistance value of the transistors is controlled to be equal to a resistance value of an external reference resistor (see U.S. Pat. No. 7,193,431).

In addition, in order to maintain the impedance and the slew rate at constant values even if a manufacturing process or an operational environment changes, a method is proposed in which output impedance of a plurality of output MOSFET's connected in parallel is adjusted by a first controlling portion that selects the number of output MOSFET's to be turned on, while a slew rate is adjusted by a second controlling portion that adjusts a drive signal of the output MOSFET to be turned on (see Japanese unexamined patent publication No. 2004-327602).

However, the interface circuit or the driver circuit described above is usually disposed inside the LSI, so values of on-resistance of on-chip resistors or transistors vary substantially in accordance with process conditions in the manufacturing steps of the LSI or its operating temperature. Therefore, the structure described in U.S. Pat. No. 7,193,431 includes an additional reference resistor provided to the outside of the LSI, which causes a problem that the number of components as well as an area for mounting components are increased due to the external reference resistor.

In addition, the circuit described in Japanese unexamined patent publication No. 2004-327602 uses an impedance adjustment code and a slew rate adjustment code for performing adjustment of the output impedance or the slew rate, but it only discloses that an external resistor should be used as a method for generating the codes.

In this way, although it is proposed that adjustment of the terminating resistor and adjustment of the slew rate should be performed in the interface circuit conventionally, the adjustment needs an external reference resistor and cannot be performed as an internal function of the LSI.

Thus, there are remaining problems in the conventional interface circuit, which are increases of the number of components and the area for mounting components, deterioration of waveform due to increase of reactance when an external resistor is used, and others.

SUMMARY OF THE INVENTION

An object of the present invention is to provide an interface circuit and a semiconductor integrated circuit, in which the entire interface circuit can be structured inside the LSI, and variation of process conditions or operating temperature can be compensated even if it occurs during the manufacturing steps, so that substantial adjustment of the terminating resistor can be performed.

Another object of the present invention is to maintain slew rate substantially constant even if variation of process conditions or temperature occurs.

An interface circuit according to an embodiment of the present invention includes a driver circuit made up of a combination of a plurality of transistors, a calibration circuit for performing selection of on and off of one or more of the plurality of transistors for adjusting on-resistance of the plurality of transistors, and a terminating resistor that is connected between an output side of the driver circuit and the transmission line. One or more of the plurality of transistors are turned on based on an output of the calibration circuit, so that a combination resistance value of the on-resistance of the plurality of transistors and the terminating resistor matches characteristic impedance of the transmission line.

Furthermore, the driver circuit, the calibration circuit and the terminating resistor may be formed on one identical semiconductor integrated circuit. The calibration circuit may be adapted to detect process variation of a transistor and a resistor formed on the semiconductor integrated circuit and temperature variation thereof.

Thus, the calibration circuit detects process variation and temperature variation of the driver circuit, the terminating resistor and the like, so that they are compensated and the terminating resistor can be adjusted substantially.

In addition, the plurality of transistors of the driver circuit may include a commonly used transistor that is not selected by the calibration circuit, so that a combination resistance value of the commonly used transistor and the terminating resistor is set to be close to the characteristic impedance of the transmission line, and one or more of the plurality of transistors except the commonly used transistor may be selected by the calibration circuit so that the combination resistance value of them is adjusted to match the characteristic impedance of the transmission line.

Note that the transmission line in the present invention includes not only cables and wires but also various ones to be a load of the output of the interface circuit. For example, the transmission line may be a connector, a reception circuit of the other end, a transmission circuit, a transceiver circuit, and the like.

According to the present invention, the entire interface circuit can be formed inside the LSI, and even if variation occurs in the process conditions of the manufacturing steps or in operating temperature, it can be compensated so that the terminating resistor can be adjusted substantially.

According to the present invention, even if variation occurs in the process conditions or in temperature, a slew rate can be maintained substantially constant.

DESCRIPTION OF THE PREFERRED EMBODIMENTS

The invention will now be described in detail with reference to the attached drawings.

Figure 1:
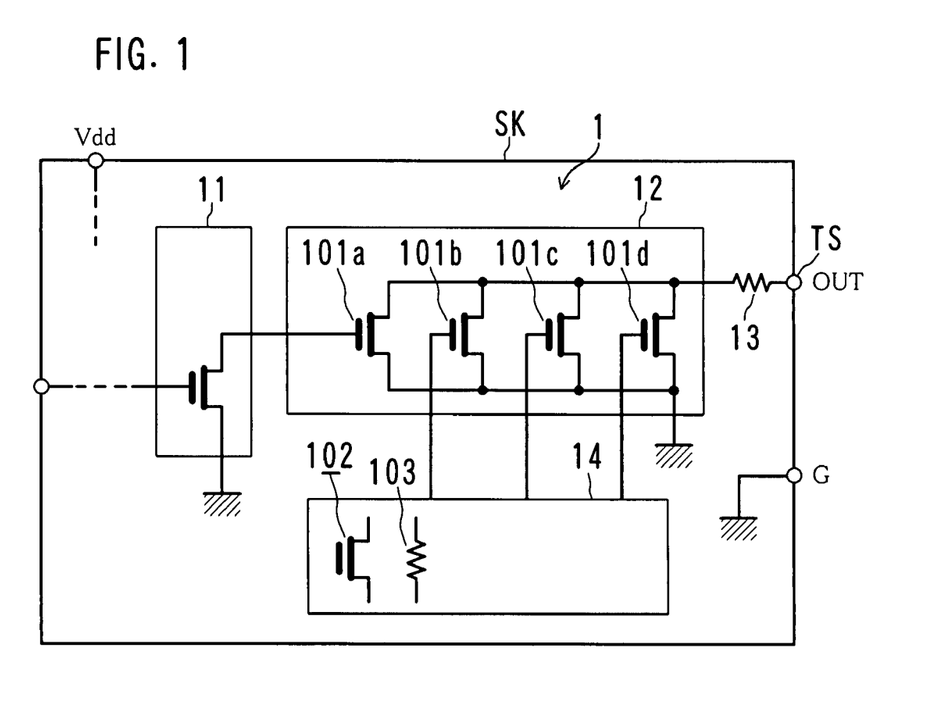
FIG. 1 is a diagram showing an example of a basic structure of a semiconductor integrated circuit according to an embodiment of the present invention.

FIG. 1 is a diagram showing an example of a basic structure of a semiconductor integrated circuit SK according to an embodiment of the present invention.

In FIG. 1, the semiconductor integrated circuit SK includes a driver circuit 12 made up of a combination of a plurality of MOSFET's (transistors) 101a-101d, a calibration circuit 14 for performing selection of on and off for adjusting on-resistance of the plurality of MOSFET's 101a-101d, and an interface circuit 1 made up of a terminating resistor 13 connected between the output side of the driver circuit 12 and a terminal TS for connection with external circuit and the like, which are formed in a single package.

The calibration circuit 14 detects process variation and temperature variation of a MOSFET 102 and a resistor 103 formed on the same semiconductor integrated circuit SK so as to turn on the plurality of MOSFET's 101b-101d selectively. Thus, a combined resistance value of on-resistance of the plurality of MOSFET's 101a-101d and the terminating resistor 13 is adjusted to be a desired value. Note that a pre-buffer circuit 11 for driving the driver circuit 12 is provided before the driver circuit 12.

Hereinafter, a case where the interface circuit 1 is an interface for a USB device will be described with reference to examples of various embodiments.

First Embodiment

Figure 2:
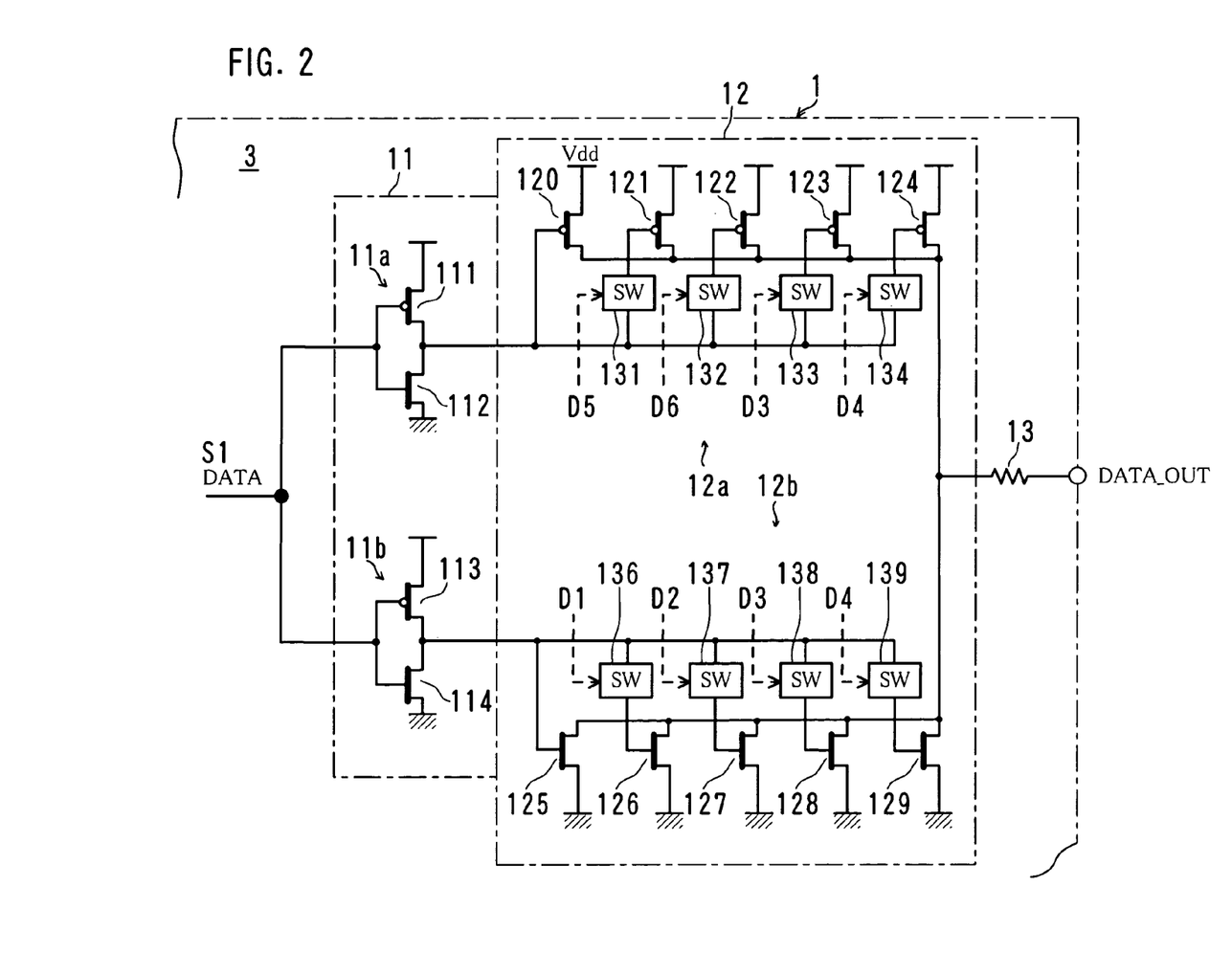
FIG. 2 is a circuit diagram showing a driving portion of a first embodiment.
Figure 3:
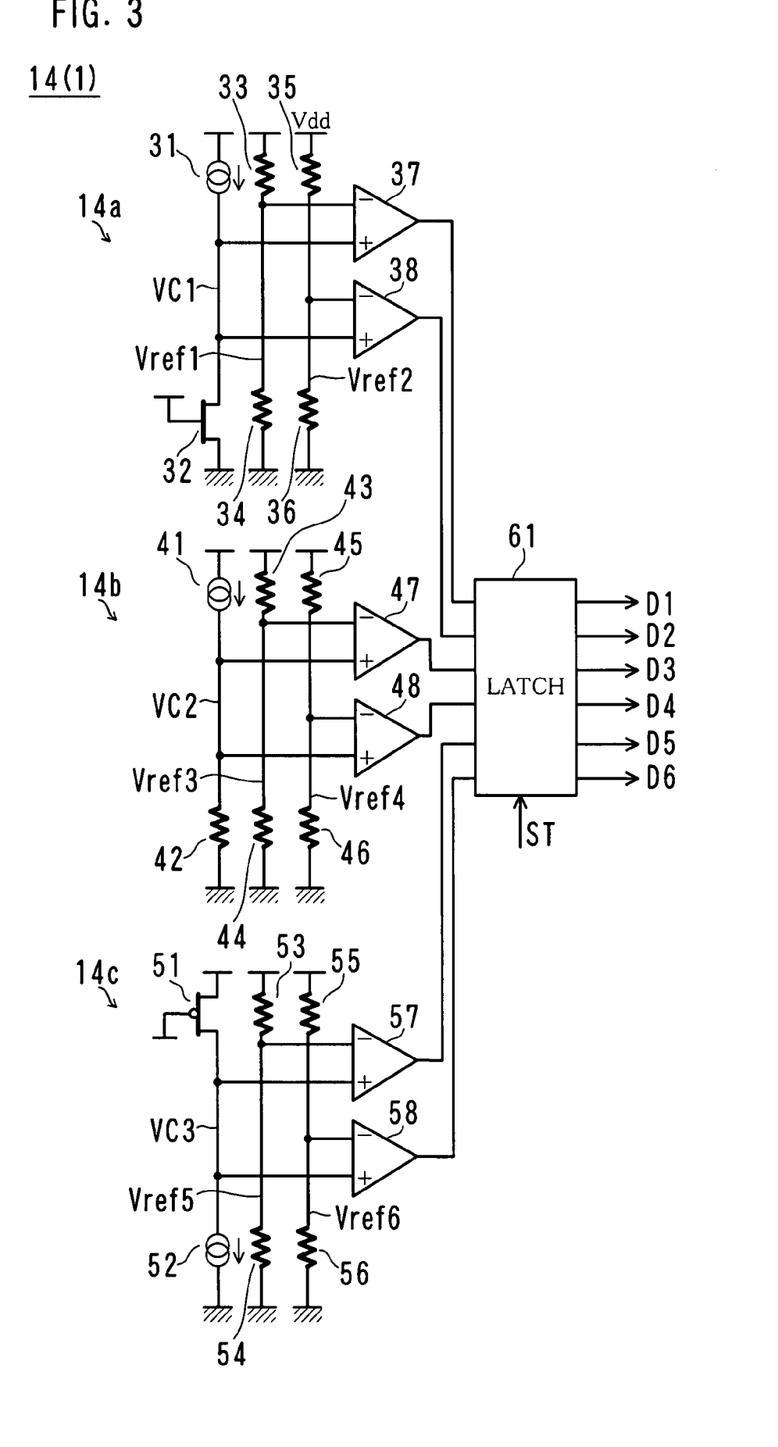
FIG. 3 is a circuit diagram showing a calibration portion.
Figure 4:
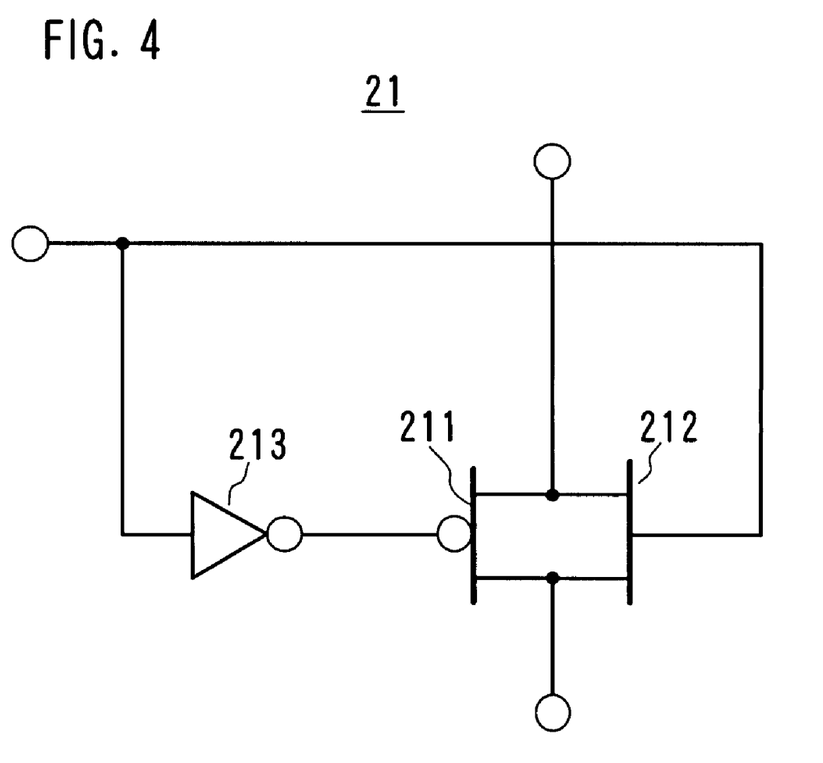
FIG. 4 is a diagram showing an example of a switch circuit.
Figure 5:
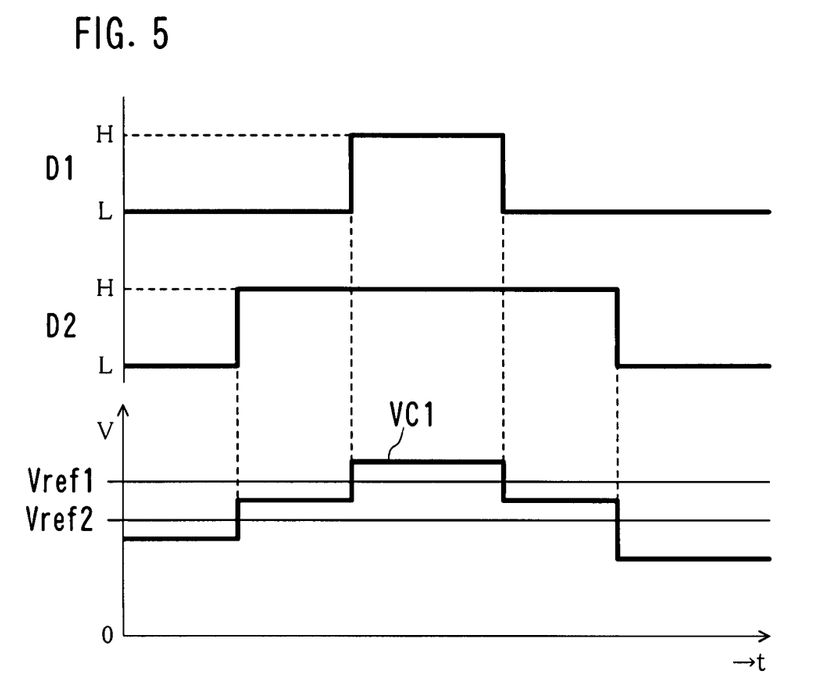
FIG. 5 is a timing chart of an example of an operation of the calibration portion.

FIG. 2 is a circuit diagram showing a driving portion 3 of the interface circuit 1 according to a first embodiment of the present invention, FIG. 3 is a circuit diagram showing a calibration portion 4 of the interface circuit 1, FIG. 4 is a diagram showing an example of a switch circuit, and FIG. 5 is a timing chart showing an example of an operation of the calibration portion 4.

The interface circuit 1 shown in FIG. 2 indicates a part of the internal circuit formed on a single LSI (semiconductor integrated circuit) that is incorporated in a USB device, for example, and has a part of functions of a transmitter according to the USB standard. The interface circuit 1 performs signal transmission between the USB device and an external transmission line, for example, a cable, a connector, a receiver circuit or a transceiver circuit of the other end, or the like.

In FIGS. 2 and 3, the interface circuit 1 is made up of the pre-buffer circuit 11, the driver circuit 12, the terminating resistor 13, the calibration circuit 14 and the like. The driving portion 3 is made up of the pre-buffer circuit 11, the driver circuit 12 and the terminating resistor 13.

The pre-buffer circuit 11 is provided before the driver circuit 12 and drives the driver circuit 12 based on an input signal (input data) S1 having two digital values. The pre-buffer circuit 11 includes two pre-buffers 11a and 11b. Each of the pre-buffers 11a and 11b is made up of a P-channel MOSFET 111 or 113 and an N-channel MOSFET 112 or 114 that are connected in series.

When the input signal S1 of the driver circuit 12 becomes "H" or "L", the output of the pre-buffer 11a is turned on ("H") or off ("L"), while the output of the pre-buffer 11b is turned off or on.

Although one P-channel MOSFET and one N-channel MOSFET are shown in each of the pre-buffers 11a and 11b in FIG. 2, it is possible that each of them has the plurality of MOSFET's connected in parallel or in series.

The driver circuit 12 includes two driver circuits 12a and 12b of P side and N side. Each of the driver circuits 12a and 12b is made up of a combination of a plurality of MOSFET'S.

More specifically, the driver circuit 12a includes five P-channel MOSFET's 120-124 connected in parallel. Four MOSFET's 121-124 among them are controlled to be turned on and off by switches 131-134. Each of sources of the MOSFET's 120-124 is connected to a power supply Vdd. As the power supply Vdd, a constant voltage power supply of 3.3 volts is used, for example. In addition, a gate of one MOSFET 120 is connected directly, and gates of other MOSFET's 121-124 are connected via the switches 131-134 to the output terminal of the pre-buffer 11a.

In addition, the driver circuit 12b has five N-channel MOSFET's 125-129 connected in parallel. Four MOSFET's 126-129 among them are controlled to be turned on and off by switches 136-139. Each of sources of the MOSFET's 125-129 is connected to the ground. A gate of one MOSFET 125 is connected directly, while gates of other MOSFET's 126-129 are connected via the switches 136-139 to the output terminal of the pre-buffer 11b.

Although one MOSFET is shown as each of the MOSFET's 120-129 in FIG. 2, a plurality of MOSFET's connected in parallel are actually used for each of them for adjusting their on-resistance. For example, a to j of MOSFET's are used for each of them, like "a" MOSFET's for the MOSFET 120, "b" MOSFET's for the MOSFET 121, and "c" MOSFET's for the MOSFET 122. Note that a to j are integers, which can be different numbers or the same number. However, it is preferable to form the state where the driver circuit 12a and the driver circuit 12b are symmetric with each other for easy control. Note that the MOSFET's are "transistors" in the present invention. It is true in the following description, too.

The switches 131-139 are controlled to be turned on and off by control signals D1-D6 from the calibration circuit 14. For example, if the control signals D1-D6 are on ("H"), the corresponding switches 131-134 and 136-139 are turned on. As such switches 131-134 and 136-139, ones having various structures can be used. For example, an analog switch 21 having a gate circuit made up of two MOSFET's 211 and 212 of P-channel and N-channel can be used as shown in FIG. 4.

An end of the terminating resistor 13 is connected to the output side of the driver circuit 12, while the other end is connected directly or indirectly to an external transmission line. For example, the other end of the terminating resistor 13 is connected to a pin terminal of the LSI for output. Since characteristic impedance of the USB transmission line is 45 ohms, a resistance value of the terminating resistor 13 is set to 39 ohms in the present embodiment, so that the output impedance of the interface circuit 1 matches the characteristic impedance.

The on-resistance of the MOSFET's 120 and 125 that are connected without using a switch is set to 6 ohms. Since the terminating resistor 13 and the on-resistance of the MOSFET's 120 and 125 are connected in series, the output impedance of the interface circuit 1 becomes 45 ohms (=39 ohms+6 ohms) in the case where the switches 131-134 and 136-139 are all off. However, the terminating resistor 13 and the on-resistance of the MOSFET's 120 and 125 vary in accordance with process conditions of the LSI in the manufacturing steps or operating temperature.

Therefore, in the present embodiment, the variation due to manufacturing conditions of the LSI and the operating temperature is detected by the calibration circuit 14, and the MOSFET's 121-124 and 126-129 are turned on selectively in accordance with a result of the detection so that the on-resistance thereof is connected in parallel with the on-resistance of the MOSFET's 120 and 125. Thus, a value of a combination resistance of the on-resistance of the MOSFET's 120-129 and the terminating resistor 13 becomes constant regardless of variation of the process conditions in the manufacturing process of the LSI or operating temperature.

In this way, in the present embodiment, impedance matching is achieved to a certain extent with the terminating resistor 13 and the MOSFET 120 or the MOSFET 125. Then, the process variation and the temperature variation is detected by the calibration circuit 14, and the switches 131-134 and 136-139 are turned on in accordance with a result of the detection. Thus, the on-resistance of the MOSFET's 121-124 and 126-129 are selectively connected so that the entire termination resistance is changed for fine adjustment. In this way, the interface circuit 1 including the terminating resistor 13 can be structured inside the LSI. Even if process variation or temperature variation occurs, it is possible to adjust the terminating resistor so as to compensate the variation so that substantial impedance matching can be performed.

Next, the calibration circuit 14 that constitutes the calibration portion 4 will be described.

The calibration circuit 14 is formed on the same LSI as the pre-buffer circuit 11, the driver circuit 12 and the terminating resistor 13 described above. Therefore, MOSFET's and registers used for them are manufactured by the same process steps, and environment conditions such as operating temperature are also the same for them.

The calibration circuit 14 is provided with a constant current circuit (constant current source) that supplies constant current to the MOSFET's and resistors. It generates voltage (drop voltage) corresponding to an actual resistance value every now and then by supplying constant current to the transistor or the resistor. If the drop voltage level is detected, the process variation or the temperature variation can be detected.

More specifically, in FIG. 3, the calibration circuit 14 includes an NMOS calibration circuit 14a, a resistor calibration circuit 14b, a PMOS calibration circuit 14c and a latch circuit 61.

The NMOS calibration circuit 14a supplies constant current to an N-channel MOSFET 32 in the on-state from a constant current source 31, and a voltage VC1 generated by the constant current is detected by a detection circuit made up of four resisters 33-36 and two comparators 37 and 38. More specifically, the voltage VC1 is compared with a voltage (reference voltage) Vref1 obtained by dividing the power supply Vdd by two resisters 33 and 34 by using the comparator (comparing circuit) 37. If the voltage VC1 exceeds the voltage Vref1, the output of the comparator 37 becomes "H". In addition, the comparator 38 compares the voltage VC1 with the voltage Vref2 that is obtained by dividing the power supply Vdd by two resisters 35 and 36. If the voltage VC1 exceeds the voltage Vref2, the output of the comparator 38 becomes "H". The outputs are retained by the latch circuit 61, and the signals in the retained state are delivered as data D1 and D2.

Note that the state "H" or "L" of the signal retained by the latch circuit 61 is updated every time when a trigger signal ST is supplied. The timing when such a trigger signal ST is supplied should be, for example, a timing just before the signal is delivered from the interface circuit 1 to the transmission line and/or a timing just before each frame in data transmission.

In the example shown in FIG. 5, a relationship of "Vref1>Vref 2" is satisfied. If the voltage VC1 exceeds the voltage Vref 2, the data D2 becomes "H". If it exceeds the voltage Vref1, both the data D1 and D2 become "H".

In addition, the resistor calibration circuit 14b and the PMOS calibration circuit 14c are also structured similarly to the NMOS calibration circuit 14a described above. The output states "H" or "L" of comparators 47, 48, 57 and 58 are retained by the latch circuit 61 and are delivered as data D3, D4, D5 and D6, respectively.

Furthermore, as for the data D1-D6, it is possible to adopt a structure in which if the data D with respect to the higher reference voltage Vref is "H", the data D with respect to the lower reference voltage Vref becomes "L". In addition, it is possible to adopt a structure in which the data D1-D6 are combined by an appropriate logic so as to generate data D for a new control, which is delivered to the switches 131-134 and 136-139.

In addition, values of the voltage Vref1-Vref6 and relationship among them should be set so that compensation of the terminating resistor with respect to the process variation or the temperature variation can be performed effectively as the entire interface circuit 1 and that it falls within the range of specification of the interface circuit 1 of the LSI as a result. For example, the values of the voltage Vref1-Vref6, values of on-resistance of the MOSFET's 120-129, and the like should be decided by a simulation.

For example, as described above, supposing that the terminating resistor 13 is 39 ohms, on-resistance of the MOSFET's 120 and 125 is 6 ohms, an error portion and a variation portion thereof should be compensated by adjusting the on-resistance of the MOSFET's 121-124 and 126-129. In this case, for example, on-resistance of the MOSFET's 121-124 and 126-129 may be set to satisfy the relationship of power of "2" like 1:2:4:8.

Note that the error and the variation of the terminating resistor 13 are smaller than those of the on-resistance of the MOSFET's 120 and 125 and have a relatively stable resistance value. Therefore, it is easier for adjustment to set the resistance value of the terminating resistor 13 larger than the on-resistance value of the MOSFET's 120 and 125.

In the interface circuit 1 of the first embodiment described above, the impedance matching can be realized by adjusting the terminating resistor even if the process variation or the temperature variation occurs. However, since the number of MOSFET's 121-124 and 126-129 to be turned on varies, gate capacitance that is a load viewed from the pre-buffers 11a and 11b varies, so the slew rate may vary. Therefore, an example of an interface circuit 1B that can maintain the slew rate substantially by suppressing variation thereof will be described as a second embodiment.

Second Embodiment

In the second embodiment, fundamental portions are the same as those of the first embodiment, so only different portions will be described.

Figure 6:
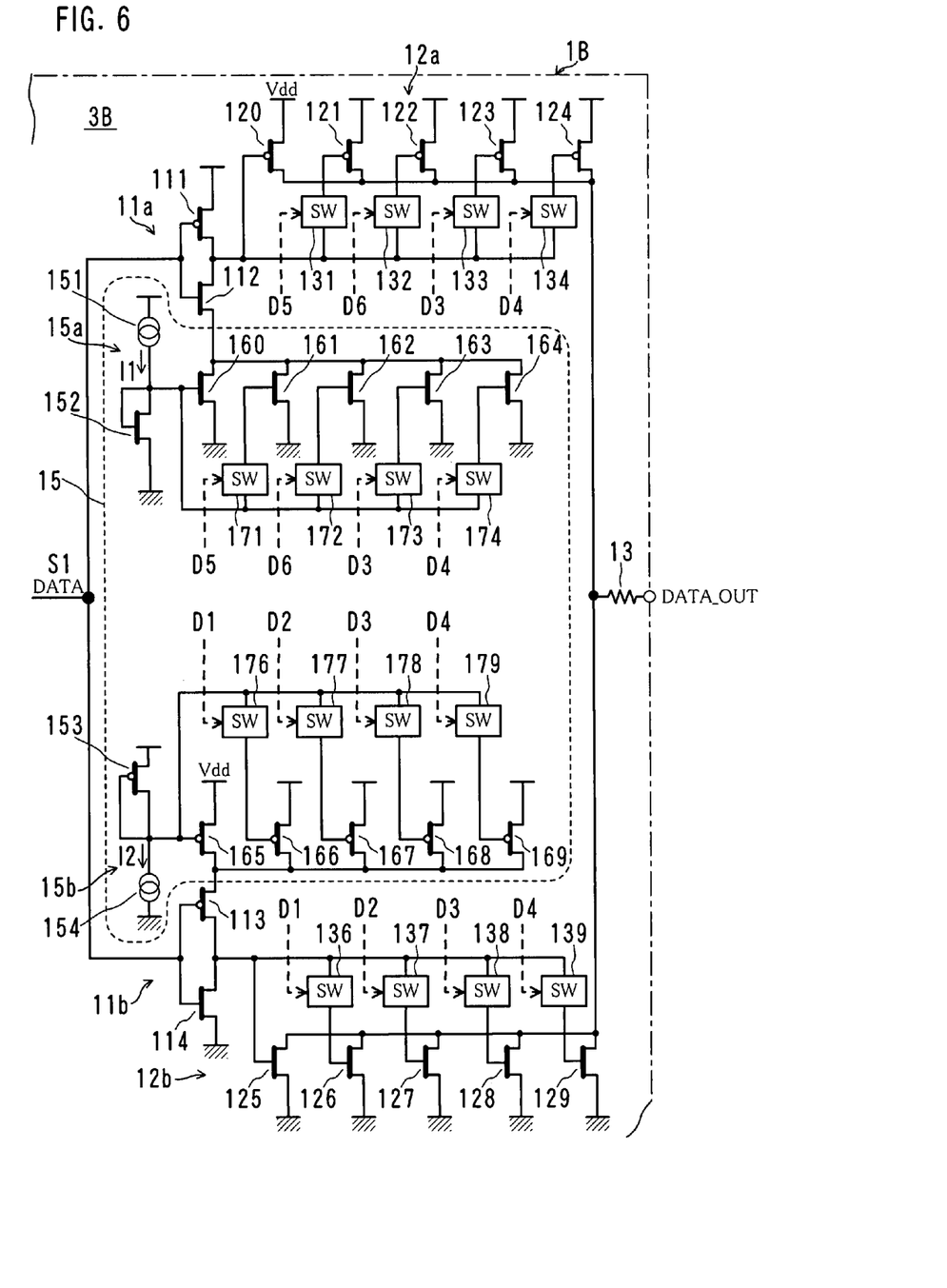
FIG. 6 is a circuit diagram of the driving portion of a second embodiment.

FIG. 6 is a circuit diagram showing a driving portion 3B of an interface circuit 1B according to the second embodiment of the present invention.

In FIG. 6, the driving portion 3B is made up of a pre-buffer circuit 11, a driver circuit 12, a terminating resistor 13 and a slope switching circuit 15. The slope switching circuit 15 has two slope switching circuits 15a and 15b.

As understood from comparison between FIG. 6 and FIG. 2, the source of a MOSFET 112 of a pre-buffer 11a in the driving portion 3B is connected to the ground not directly but indirectly via the slope switching circuit 15a. In addition, the source of a MOSFET 113 of a pre-buffer 11b is connected to the power supply Vdd not directly but indirectly via the slope switching circuit 15b.

In the slope switching circuit 15a, MOSFET 152 and MOSFET's 160-164 constitute a current mirror circuit with the MOSFET 152 as a reference transistor. In other words, a ratio of current (reference current) flowing in the MOSFET 152 to current flowing in each of the MOSFET's 160-164 is decided by a ratio (current mirror ratio) between sizes (element sizes W and L) of the transistors. In other words, current flowing in each of the MOSFET's 160-164 becomes a value obtained by multiplying current flowing in the MOSFET 152 as the reference transistor by the current mirror ratio.

In addition, since the constant current I1 from the constant current source 151 flows in the MOSFET 152, current having a value obtained by multiplying the current I1 by each current mirror ratio flows in each of the MOSFET's 160-164.

As for the slope switching circuit 15b too, the MOSFET 153 and the MOSFET's 165-169 constitute a current mirror circuit with the MOSFET 153 as a reference transistor in the same manner. Therefore, current flowing in each of the MOSFET's 165-169 has a value obtained by multiplying current flowing in the MOSFET 153 as the reference transistor by the current mirror ratio.

In addition, since constant current I2 from the constant current source 154 flows in the MOSFET 153, current having a value obtained by multiplying the current I2 by each current mirror ratio flows in each of the MOSFET's 165-169.

The MOSFET's 161-164 and 166-169 are controlled to be turned on and off by the switches 171-174 and 176-179, respectively.

The switches 171-174 and 176-179 are controlled to be turned on and off by the control signals D1-D6 from the calibration circuit 14 shown in FIG. 3. For example, when the control signals D1-D6 are on ("H"), the corresponding switches 171-174 and 176-179 are turned on.

As understood from FIG. 6, for example, when the control signal D1 is turned on, the MOSFET 126 and the MOSFET 166 are turned on in synchronization with each other. When the control signal D2 is turned on, the MOSFET 127 and the MOSFET 167 are turned on in synchronization with each other. In addition, when the control signal D3 is turned on, the MOSFET 128 and the MOSFET 168, as well as the MOSFET 123 and the MOSFET 164 are turned on in synchronization with each other. In this way, the MOSFET's 161-164 and 166-169 are adapted to be turned on and off in synchronization with on and off of the MOSFET's 121-124 and 126-129.

Therefore, when the MOSFET's 121-124 and 126-129 are turned on for impedance matching, the MOSFET's 161-164 and 166-169 are turned on for supplying drive current corresponding to a change of gate capacitance due to it. In other words, when the number of MOSFET's 121-124 and 126-129 to be driven increases, the number of MOSFET's 161-164 and 166-169 that supply the drive current is increased so as to increase the current.

Since current that flows in the MOSFET's 152 and 153 as reference transistors and a current mirror ratio of the MOSFET's 161-164 and 166-169 are adjusted, appropriate drive current corresponding to a change of the gate capacitance can be supplied. Thus, it is possible to suppress variations of the rise time Tr and the fall time Tf of the signal waveforms delivered from the driver circuits 12a and 12b and to maintain them substantially constant.

In this way, according to the interface circuit 1B of the second embodiment, even if process variation or temperature variation occurs, it is possible to realize impedance matching and to maintain the slew rate substantially constant.

Next, another example will be described, which has a structure for preventing capacitance as a load from changing even if the gate capacitance changes, instead of adjusting the drive current in accordance with the change of the gate capacitance, for the same purpose as the second embodiment.

Third Embodiment

Figure 7:
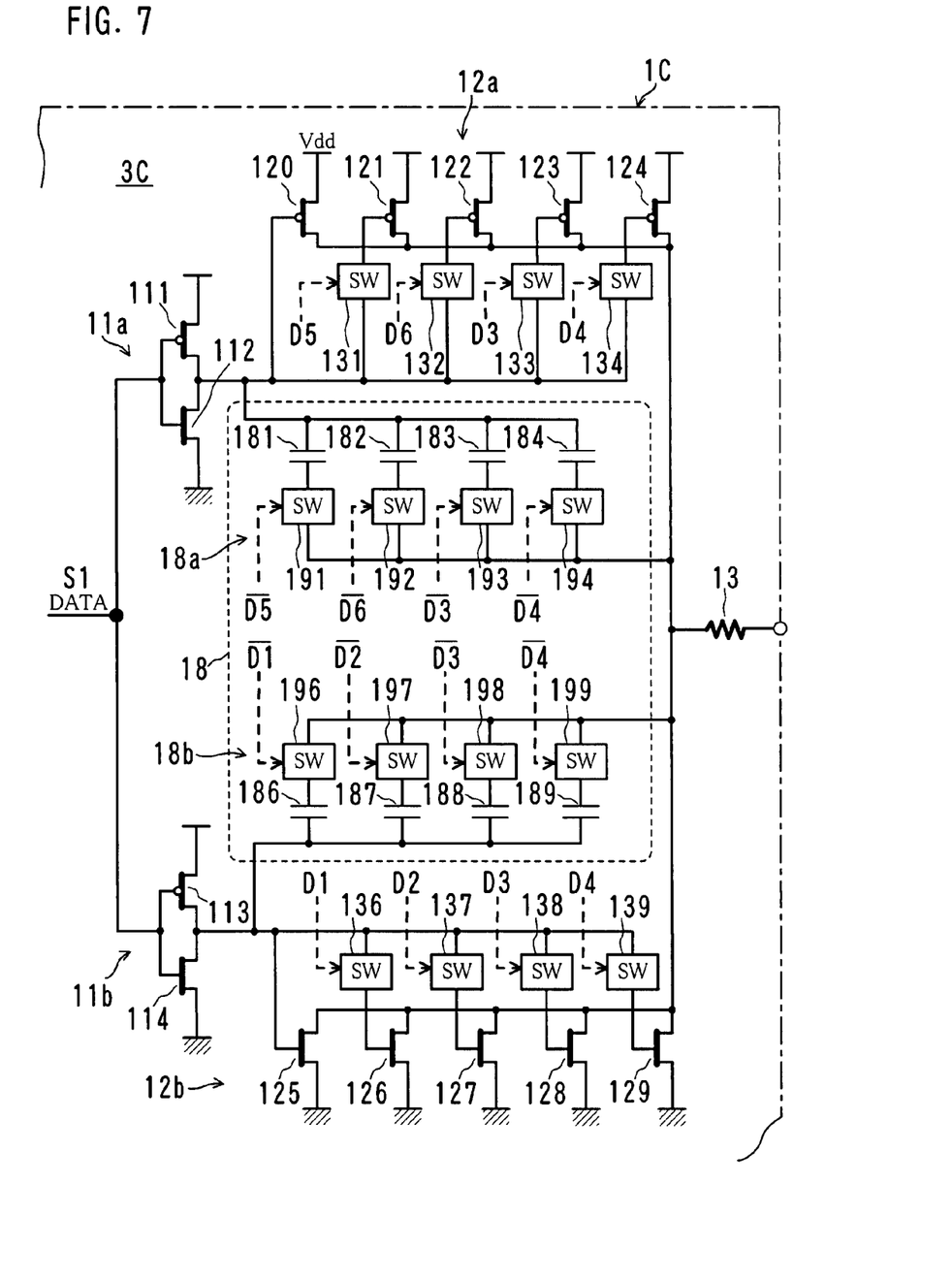
FIG. 7 is a circuit diagram of the driving portion of a third embodiment.

Under the condition of the same drive current (drive capacity) of the pre-buffers 11a and 11b, the rise time Tr and the fall time Tf of the delivered signal waveform becomes longer as capacitance of the load (gate capacitance) is larger, while the rise time Tr and the fall time Tf become shorter as the capacitance of the load is smaller.

Therefore, if the drain and the gate of the MOSFET's of the driver circuits 12a and 12b are connected by capacitance Cm, an effect of increasing the gate capacitance by Cm×gm×RL is obtained as a mirror effect. Here, gm is transconductance between the MOSFET's of the driver circuits 12a and 12b, and RL is load resistance.

If the number of MOSFET's that are turned on in the driver circuits 12a and 12b increases or decreases, gm changes in proportion to the number. Therefore, true gate capacitance and mirror capacitance also increase or decrease in proportion to it. Therefore, in order to prevent variations of the rise time Tr and the fall time Tf that may vary as they are, a total gate capacitance value is controlled to be constant by connecting or disconnecting appropriate capacitance for compensation between the drain and the gate at the same time as switching of the MOSFET.

More specifically, if the number of MOSFET's of the driver circuits 12a and 12b is large (if the gate capacitance is large), the capacitance for compensation is decreased. On the contrary, if the number of MOSFET's is small, the capacitance for compensation is increased. A third embodiment described below is one of examples of the method.

In the third embodiment, fundamental portions are the same as those of the first and second embodiments, so only different portions will be described.

FIG. 7 is a circuit diagram showing a driving portion 3C of an interface circuit 1C according to the third embodiment of the present invention.

In FIG. 7, the driving portion 3C is made up of a pre-buffer circuit 11, a driver circuit 12, a terminating resistor 13 and a capacitance switching circuit 18. The capacitance switching circuit 18 includes two capacitance switching circuits 18a and 18b.

As understood from comparison between FIGS. 7 and 2, the capacitance switching circuit 18a is inserted as a load of one of the pre-buffers 11a in the driving portion 3C, while the capacitance switching circuit 18b is inserted as a load of one of the other pre-buffer 11b.

The capacitance switching circuit 18a includes four capacitors 181-184 and four switches 191-194. When the switches 191-194 are turned on, the corresponding capacitors 181-184 are connected as a load of the pre-buffer 11a.

The four capacitors 181-184 have the same capacitance as the four MOSFET's 121-124. The switches 191-194 are controlled to be turned on and off by inverted signals of the control signals D5, D6, D3 and D4, respectively. For example, if the control signal D5 is turned on ("H"), the inverted signal thereof becomes off ("L"), and the corresponding switch 191 is turned off.

The capacitance switching circuit 18b also includes four capacitors 186-189 and four switches 196-199 in the same manner. When the switches 196-199 are turned on, the corresponding capacitors 186-189 are connected as a load of the pre-buffer 11b.

The four capacitors 186-189 have the same capacitance as those of the four MOSFET's 126-129, respectively. The switches 196-199 are controlled to be turned on and off by inverted signals of the control signals D1-D4, respectively. For example, when the control signal D1 is turned on ("H"), the inverted signal thereof becomes off ("L"), and the corresponding switch 196 is turned off. Note that NOT circuits are used, for example, for obtaining the inverted signals of the control signals D1-D6.

Therefore, even if one of the MOSFET's 121-124 and 126-129 is connected as a load of the pre-buffers 11a and 11b, the capacitors 181-184 and 186-189 are connected having the same capacitance value as those of the MOSFET's that are not connected. Thus, a value of the capacitance to be a load of the pre-buffers 11a and 11b is always constant.

In this way, according to the interface circuit 1C of the third embodiment, even if process variation or temperature variation occurs, it is possible to realize impedance matching and to maintain the slew rate substantially constant.

Note that it is possible in the third embodiment to set the capacitance values of the capacitors 181-184 and 186-189 to be independent capacitance values without associated with the gate capacitance of the MOSFET's 121-124 and 126-129 and to generate the control signal for controlling the switches 196-199 by an appropriate logic instead of being the inverted signals of the control signals D1-D6 so that the capacitance can be compensated in accordance with the switching of the MOSFET's 121-124 and 126-129. In this case, the capacitance values of the capacitors 181-184 and 186-189 and the control signal for controlling the switches 196-199 should be decided so that an optimal result can be obtained by a simulation or the like, for example.

Fourth Embodiment

Next, another example of the calibration circuit will be described as a fourth embodiment.

Figure 8:
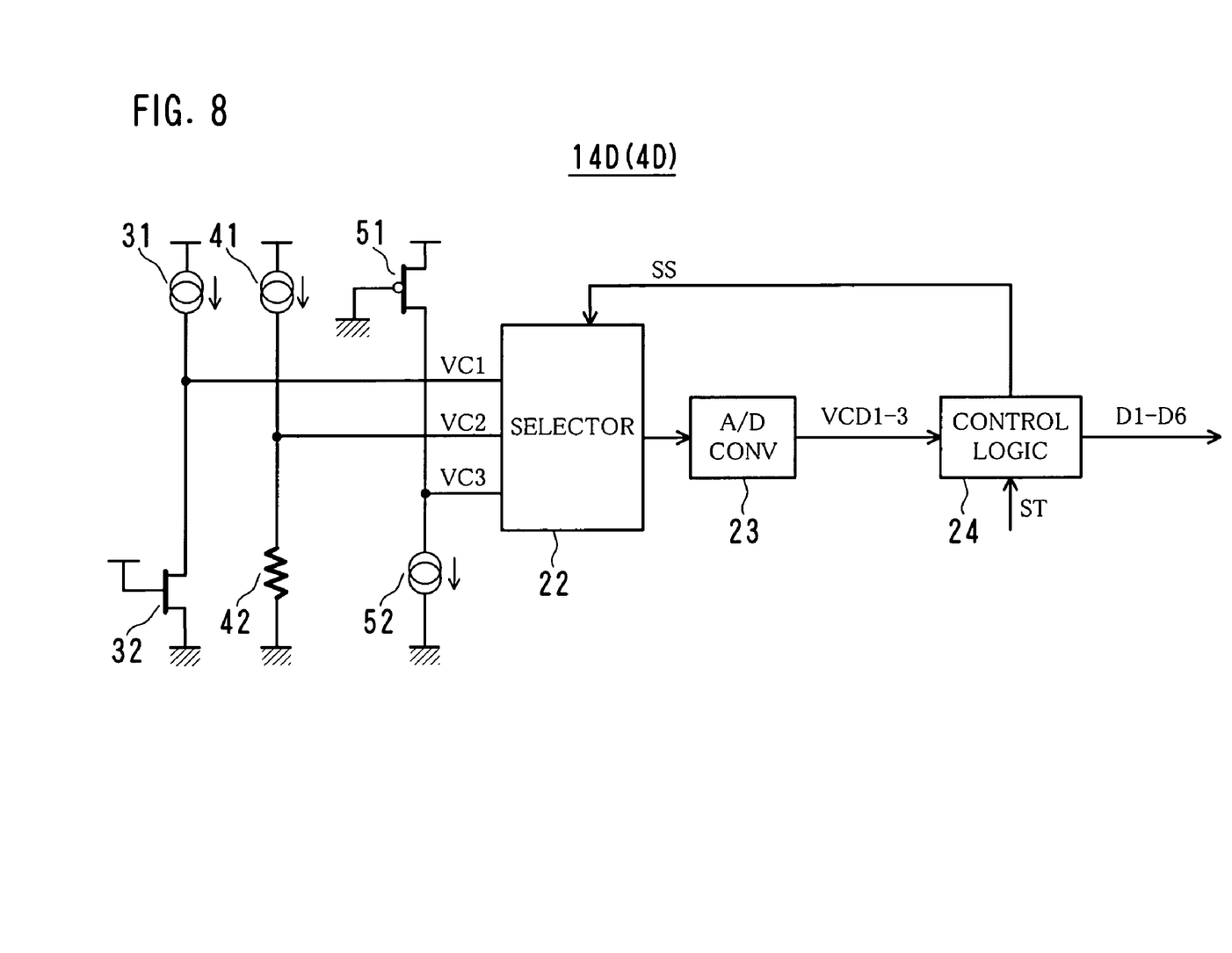
FIG. 8 is a circuit diagram of the calibration portion of a fourth embodiment.

FIG. 8 is a circuit diagram showing a calibration portion 4D of the fourth embodiment.

In a calibration circuit 14D that constitutes the calibration portion 4D, voltages VC1-VC3 generated by constant current from the constant current sources 31, 41 and 52 that flows in a MOSFET 32, a resistor 42 and a MOSFET 51, respectively, are selected one by one by a selector 22 and is supplied to an A/D convertor 23. The A/D convertor 23 converts the analog voltages VC1-VC3 into digital data VCD1-VCD3 having eight bits or other number of bits with high accuracy and delivers it to an operational control portion 24. The operational control portion 24 performs computing based on the values of the digital data VCD1-VCD3 and generates the control signals D1-D6. The switches 131-139 and the like are controlled based on the generated control signals D1-D6. Note that the operational control portion 24 controls the selector 22 based on the signal SS so that the voltages VC1-VC3 are supplied selectively, and it fetches the digital data VCD1-VCD3 at appropriate timing.

Note that computing contents and process contents in the operational control portion 24 should be decided by a simulation or the like so that the process variation and temperature variation can be detected appropriately and that impedance matching can be performed appropriately based on the generated control signals D1-D6.

In this way, if the calibration circuit 14D is used, the voltages VC1-VC3 generated in the MOSFET 32, the resistor 42 and the MOSFET 51 are detected by the A/D convertor with high accuracy, and control contents can be set delicately by computing in the operational control portion 24. Therefore, according to the calibration portion 4D of the fourth embodiment, it is possible to perform impedance matching and stabilizing of the slew rate with higher accuracy and more precisely than the case where the calibration circuit 14 of the first embodiment is used. Note that the calibration circuit 14 of the first embodiment has an advantage of a simple circuit and a small mounting area.

In the embodiments described above, the MOSFET's 120 and 125 correspond to the commonly used transistors in the present invention. The driver circuit 12 corresponds to the output circuit of the semiconductor integrated circuit in the present invention. The slope switching circuit 15 corresponds to the current switching circuit in the present invention. The constant current sources 151 and 154 correspond to the second constant current circuits in the present invention. The capacitance switching circuit 18 corresponds to the capacitance circuit in the present invention. In addition, the above-mentioned LSI in which the interface circuit 1 or 1B-1D corresponds to the semiconductor integrated circuit in the present invention.

In the embodiments described above, it is possible to provide various necessary circuits after the terminating resistor 13. In addition, the pre-buffer circuit 11, the driver circuit 12, the configuration of circuit, the structure thereof, the element constant, the number of elements and the like of a part or a whole of the terminating resistor 13, the calibration circuit 14 or 14D, the slope switching circuits 15 and 18 and the interface circuit 1 or 1B-1D can be modified variously in accordance with the spirit of the present invention.

Although the embodiments of the present invention are described above, the present invention can be embodied variously without limiting to the above embodiments.

What is claimed is:

1. An interface circuit for performing signal transmission with a transmission line, comprising:
   a driver circuit made up of a combination of first transistor controlled based on an input signal and a second transistor;
   a control circuit that performs selection of on and off of the second transistor; and
   a terminating resistor that is connected between an output side of the driver circuit and the transmission line, wherein second transistor is turned on or off based on an output of the control circuit, the driver circuit, the control circuit, and the terminating resistor are formed on one identical semiconductor integrated circuit, the control circuit is adapted to detect process variation and temperature variation of a third transistor and a resistor formed on the control circuit, and the control circuit includes a constant current circuit that supplies constant current to the third transistor and the resistor formed on the control circuit, and a detection circuit that detects the process variation and the temperature variation by detecting voltages generated in the third transistor and the resistor respectively by the constant current.

2. The interface circuit according to claim 1, wherein the control circuit includes a comparing circuit that compares the voltage generated in each of the third transistor and the resistor by the constant current with a plurality of reference voltages, and the second transistor is turned on based on an output of the comparing circuit.

3. An interface circuit for performing signal transmission with a transmission line, comprising:

a driver circuit made up of a combination of a first transistor controlled based on an input signal and a second transistor;

a control circuit that performs selection of on and off of the second transistor;

a terminating resistor that is connected between an output side of the driver circuit and the transmission line;

a pre-buffer circuit provided before the driver circuit, and a current switching circuit that switches drive current of the pre-buffer circuit, wherein the second transistor is turned on or off based on an output of the control circuit, and the current switching circuit performs switching of drive current of the pre-buffer circuit in synchronization with selection of on and off of the second transistor in the driver circuit, so that rise time and fall time of an output waveform of the driver circuit is controlled to be constant.

4. The interface circuit according to claim 3, wherein the current switching circuit includes a second constant current circuit and a current mirror circuit corresponding to current of the second constant current circuit.

5. The interface circuit according to claim 1, wherein the driver circuit is connected in parallel to a capacitance circuit as a load that can switch a value of capacitance, and the value of capacitance of the capacitance circuit is switched in synchronization with selection of on and off of the second transistor, so that rise time and fall time of an output waveform of the driver circuit is controlled to be constant.

6. A semiconductor integrated circuit comprising:

a driver circuit made up of a combination of a first transistor controlled based on an input signal and a second transistor;

a control circuit that performs selection of on and off of the second transistor; and a terminating resistor that is connected between an output side of the driver circuit and a terminal for connection to an external circuit, wherein the second transistor is turned on or off based on an output of the control circuit, the driver circuit, the control circuit, and the terminating resistor are formed on the semiconductor integrated circuit, the control circuit is adapted to detect process variation and temperature variation of a third transistor and a resistor formed on the control circuit, and the control circuit includes a constant current circuit that supplies constant current to the third transistor and the resistor formed on the control circuit, and a detection circuit that detects the process variation and the temperature variation by detecting voltages generated in the third transistor and the resistor respectively by the constant current.

* * * * *